United States Patent [19]

Clodgo et al.

[11] Patent Number: 5,166,038
[45] Date of Patent: Nov. 24, 1992

[54] ETCH RESISTANT PATTERN FORMATION VIA INTERFACIAL SILYLATION PROCESS

[75] Inventors: Donna J. Clodgo; Rosemary A. Previti-Kelly, both of Richmond; Anita B. Stratton, Jericho, all of Vt.

[73] Assignee: International Business Machines Corporation, Armonk, N.Y.

[21] Appl. No.: 387,245

[22] Filed: Jul. 27, 1989

[51] Int. Cl.$^5$ ................................. G03C 5/16
[52] U.S. Cl. ........................ 430/325; 430/272; 430/327; 430/330
[58] Field of Search ............... 430/325, 327, 330, 326, 430/272

[56] References Cited

U.S. PATENT DOCUMENTS

| | | | |
|---|---|---|---|
| 4,397,937 | 8/1983 | Clecak et al. | 430/192 |
| 4,426,247 | 1/1984 | Tamamura et al. | 156/643 |
| 4,464,460 | 8/1984 | Hiraoka et al. | 430/323 |
| 4,481,049 | 11/1984 | Reichmanis et al. | 156/643 |
| 4,507,384 | 3/1985 | Morita et al. | 430/311 |
| 4,521,274 | 6/1985 | Reichmanis et al. | 156/643 |
| 4,564,576 | 1/1986 | Saigo et al. | 430/197 |
| 4,596,761 | 6/1986 | Brault | 430/296 |
| 4,613,398 | 9/1986 | Chiong et al. | 430/324 |
| 4,665,006 | 5/1987 | Sachdev et al. | 430/270 |
| 4,751,170 | 6/1988 | Mimura et al. | 430/296 |
| 4,921,778 | 5/1990 | Thackeray | 430/326 |

*Primary Examiner*—Charles L. Bowers, Jr.
*Assistant Examiner*—Thorl Chea

[57] ABSTRACT

A pattern is formed by first coating on a substrate a photosensitive organic polymer layer, and then an overlying film comprising an aminoalkoxysilane. After exposure in a predetermined pattern to radiation, the coated substrate is heated at a temperature so as to form an interfacial silicon-containing coupling layer between the film and the crosslinked portions of the polymer layer. Then, the coated substrate is contacted with a solvent so that the uncrosslinked portions of the polymer layer and the overlying portions of the film are simultaneously removed from the substrate. The process provides a high resolution, high aspect ratio pattern which demonstrates excellent etch resistance, while avoiding costly and cumbersome image transfer steps.

14 Claims, No Drawings

ETCH RESISTANT PATTERN FORMATION VIA INTERFACIAL SILYLATION PROCESS

The present invention relates to a process for forming a pattern on a substrate, and, more particularly, to a process for forming a pattern which is resistant to oxygen-reactive ion etching.

It is known in the art to incorporate silicon into a resist in order to render it more resistant to oxygen-reactive ion etching. To accomplish this, silicon may be introduced into the resist after it is applied on a substrate. See, for example, U.S. Pat. No. 4,751,170, issued to Mimura, et al. on Jun. 14, 1988, where a desired pattern is formed in a resist, which includes a layer of an active polymer and a layer of an inert polymer. Then, the active polymer layer of the pattern is contacted with an organic silane compound while being irradiated with deep ultraviolet rays, so as to introduce silyl groups.

Alternatively, the resist may be made from silicon-containing materials. As examples o±this, see U.S. Pat. No. 4,481,049, issued to Reichmanis, et al. on Nov. 6, 1984, where a resist is formed by the polymerization of monomers including a silicon derivative of methyl methacrylate; and U.S. Pat. No. 4,521,274, issued to Reichmanis, et al. on Jun. 4, 1985, where a resist is prepared by the condensation of monomers including formaldehyde and/or acetaldehyde and a silicon-substituted phenol.

See also, U.S. Pat. No. 4,507,384, issued to Morita, et al. on Mar. 26, 1985 (a high energy radiation-sensitive, negative resist containing a select siloxane polymer); U.S. Pat. No. 4,665,006, issued to Sachdev, et al. on May 12, 1987 (a positive resist containing a radiation sissionable polymeric system having organopolysiloxane segments); and U.S. Pat. No. 4,564,576 (a resist material which contains a polymer produced by polymerizing a monomer having an allylsilyl group).

Although silicon-containing species impart greater etch resistance to the resist, such "silylated" resists generally are not soluble in conventional stripping solutions. As a consequence, it is typical to interpose a release layer, such as a polyimide layer, between the resist and the substrate. However, this introduces an additional image transfer step into the process with resulting expense. Further, in carrying out an oxygen-reactive ion etch of the polyimide through the silylated resist, a grossly roughened surface (or "grass") is produced, thereby limiting the minimum image size obtainable from systems of this type.

Another approach for forming a pattern which is resistant to oxygen-reactive ion etching is disclosed in U.S. Pat. No. 4,464,460. According to the process in that patent, a substrate is coated with a polymer layer, and then a polysilane layer is applied to the polymer. The polysilane layer is exposed and developed to uncover portions of the polymer layer, and the polysilane image is then transferred through the polymer layer via oxygen-reactive ion etching to expose portions of the substrate. Optionally, the polysilane may be coated with a resist layer to form a trilevel system. While presenting some advantages, this technique is not entirely satisfactory in that it still involves an image transfer step through the polymer layer, resulting in grass formation.

Reference is also made to U.S. Pat. No. 4,426,247, issued to Tamamura, et al. on Jan. 17, 1984. In that patent, a resist pattern is formed by: forming an organic polymeric material layer on a substrate, forming a silicone layer, selectively irradiating a surface of the silicone layer with a high-energy beam, exposing the surface of the silicone layer to a radical addition polymerizable monomer gas so as to form a graft polymer film on an irradiated portion of the surface of the silicone layer, performing reactive ion etching using the graft polymer film as a mask so as to form a silicone pattern, and performing reactive ion etching using the silicone pattern as a mask so as to form a pattern of the organic polymeric material. This process also entails several image transfer steps, leading to grass formation.

Now, in accordance with the present invention, there is provided an improved process for forming a pattern, which is resistant to oxygen-reactive ion etching, on a substrate. This is achieved by first coating on the substrate a photosensitive organic polymer layer, coating on the polymer layer a film comprising an aminoalkoxysilane, exposing the coated substrate in a predetermined pattern to radiation to cause crosslinking or scission of the exposed portions of the polymer layer, heating the coated substrate at a temperature which is sufficient to cause formation of an interfacial silicon-containing coupling layer between the film and the crosslinked portions of the polymer layer, and contacting the coated substrate with a solvent so as to simultaneously remove the uncrosslinked portions of the polymer layer and the overlying portions of the film, thereby forming a pattern which is resistant to oxygen-reactive ion etching.

In the practice of the invention, there is produced a pattern in the polymer layer having high resolution and a high aspect ratio. This is achieved while avoiding costly and cumbersome image transfer steps, and without the formation of grass. Further, the polymer pattern is readily removable from the substrate with conventional stripping solutions, without requiring an additional, underlying release layer.

In forming the pattern according to the process of the invention, a photosensitive organic polymer layer is first coated on a substrate. Examples of suitable organic polymer materials include positive and negative resist materials, such as the usual phenol-formaldehyde novolac resins, polymethyl methacrylate, polyisoprenes, etc., as well as other materials which are photosensitive, such as photosensitive polyimide formulations, e.g., the methacrylate esters of an amine and an anhydride, commercially available from Ciba-Geigy under the designation, "PROBIMIDE". Preferably, the organic polymer layer comprises a novolac resin, and most preferably, a resist, as described in U.S. Pat. No. 4,397,937, which is based on a phenolic resin and a diester of a 1-oxo-2-diazonaphthalene sulfonic acid with an unsymmetrical primary or secondary aliphatic diol as a sensitizer. In other preferred embodiments, a resist which is based on an m-cresol novolac resin with a diazo-ketone sensitizer, commercially available from American Hoechst Co. under the designation "AZ4330", is employed.

Any suitable substrate, such as a surface of a microelectronic device, e.g. a semiconductor, may be employed, the nature of the surface not being critical, so long as the organic polymer material will adhere to it. Thus, the substrate may be an inorganic substrate, such as Si, $SiO_2$, $Si_3N_4$, $Al_2O_3$ or common metallurgies, such as Al, Cu, Ti, Cr, W or alloys, or an organic insulation layer (e.g., a polyimide), and so forth.

The organic polymer material is applied to the substrate in a conventional fashion. Typically, it is spun onto the substrate at a spin speed within the range from about 2000-6000 rpm, depending upon the desired thickness of the coating, which generally ranges from about 1.0-4.0 μm. Preferably, after application of the organic polymer material, the coated substrate is heated, usually at a temperature ranging from about 80°-130° C. for about 5-30 minutes, although the actual temperature and time may vary as should be apparent to those skilled in the art.

Next, a film comprising an aminoalkoxysilane is coated on the organic polymer layer. Suitable aminoalkoxysilanes include aminotrialkoxysilanes represented by the formula:

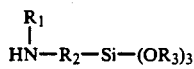

wherein: $R_1$ is a hydrogen atom or a saturated hydrocarbon residue or an amino-substituted, saturated hydrocarbon residue, having 1 to 5 carbon atoms; $R_2$ is a saturated hydrocarbon residue having 2 to 6 carbon atoms; and $R_3$ is a saturated hydrocarbon residue having 1 to 5 carbon atoms; and mixtures thereof.

Preferred aminoalkoxysilanes include aminotrialkoxysilanes represented by the above formula, wherein $R_1$ is a hydrogen atom or a saturated hydrocarbon residue or an amino-substituted, saturated hydrocarbon residue, having 2 or 3 carbon atoms; $R_2$ is a saturated hydrocarbon residue having 3 to 6 carbon atoms; and $R_3$ is a saturated hydrocarbon residue having 1 to 4 carbon atoms; and mixtures thereof.

A particularly preferred group of aminoalkoxysilanes includes the following aminotrialkoxysilanes: γ-aminopropyltrimethoxysilane, γ-aminopropyltriethoxysilane, N-β-(aminoethyl)-γ-aminopropyltrimethoxysilane and N-β-(aminoethyl)-γ-aminopropyltriethoxysilane and mixtures thereof.

In general, a solution of one or more aminoalkoxysilanes is applied to the organic polymer layer by conventional spin application techniques, usually at a spin speed within the range from about 2000-6000 rpm, to form a film having a thickness preferably of about 0.3-1.0 μm. In forming the solution, any suitable solvent can be employed, for example: alcohols, such as methanol, ethanol, propanol, isopropanol, butanol, isobutanol, isoamyl alcohol, and the like; ethers, such as the cellosolves, e.g. methyl cellosolve, diglyme, dioxane, butyl carbitol, diethyl ether, tetrahydrofuran, anisole, and the like; aromatic alcohols, such as phenol, and the like; polyhydric alcohols, such as ethylene glycol, tetramethylene glycol, glycerol, and the like; ketones, such as methyl ethyl ketone, methyl isobutyl ketone, diethyl ketone, and the like; etc., as will be apparent to those skilled in the art. Preferred solvents include methanol, ethanol and isopropanol. In general, the concentration of the solution can vary over a wide range, but preferably from about 1 to about 10 parts by volume of solvent per part by volume of the aminoalkoxysilane is utilized. Preferably, after application of the solution, the coated substrate is subjected to a heating step, at a temperature from about 90°-150° C. for about 5-30 minutes; however, as will be apparent to those skilled in the art, the actual conditions may vary.

The coated substrate is then exposed in a predetermined pattern to radiation, such as UV, preferably with a wavelength in the range of about 365-450 nm. Typically, an exposure dose in the range of about 100-300 mj/cm² is employed, although the specific exposure dose will vary depending upon the nature of the organic polymer material, as well as other factors which should be apparent to those skilled in the art. During exposure, the exposed portions of the organic polymer layer undergo crosslinking or scission, depending upon whether a negative or positive-acting material is used, as is well known to those skilled in the art.

Following the exposure step, the coated substrate is heated. Importantly, this step must be carried out at a temperature such that a silicon-containing coupling layer will form at the interface between the film and the crosslinked portions of the polymer layer. Preferably, the temperature at which this step is carried out ranges from about 90°-160° C., and more preferably, from about 90°-105° C.; typically the time ranges from about 5-30 min.; however, both temperature and time may vary widely, depending upon a number of factors, such as the exact aminoalkoxysilane employed, and so forth.

The coated substrate is then contacted with a solvent. In the uncrosslinked portions, the polymer layer is dissolved, and this results in simultaneous removal of those portions and the overlying portions of the film. However, the crosslinked portions of the polymer layer are not dissolved, and those portions and the overlying portions of the film remain on the substrate to form a pattern, which is silicon rich due to the presence of the silicon-containing coupling layer.

Any suitable developer, such as a KOH solution, can be used for this purpose. After development, there is obtained a high resolution, high aspect ratio pattern that demonstrates excellent resistance to oxygen-reactive ion etching. When desired, the resulting pattern can be readily removed from the substrate by employing a conventional stripper, such as N-methyl pyrolidone at a temperature of about 80° C.

In carrying out the process of the invention, it has been found that the post-exposure heating step must be performed in order to form a pattern with the desired degree of oxygen-reactive ion etch resistance. When the organic polymer layer comprises a resist based on a phenolic resin, for example, it is believed that Si-O-phenyl groups are formed at the interface between the film and the crosslinked portions of the polymer during this step. Otherwise, without this step, the coupling effect is not observed, and the resulting image does not exhibit satisfactory etch resistance.

The following examples are provided to illustrate the invention. In the examples, the aminoalkoxysilane solutions were prepared by employing the ingredients in proportions such that a 100 ml aminoalkoxysilane solution consisted of 35 ml aminoalkoxysilane, 3.5 ml water and 61.5 ml methanol, with 5 drops surfactant (commercially available from Minnesota Mining and Manufacturing under the designation "FC93").

EXAMPLE 1

A 1.6μ thick layer of resist[1] was coated on a wafer by spin application at 3500 rpm for 30 seconds, followed by baking at 80° C. for 20 minutes. Then, a 0.7μ thick film was coated on the resist by spin application of a solution of γ-aminopropyltriethoxysilane[2] at 3500 rpm for 30 seconds, followed by baking at 90° C. for 10 minutes.

[1] A novolac resist, based on a phenolic resin and a diester of a 1-oxo-2-diazonaphthalene sulfonic acid with an unsymmetrical primary or secondary aliphatic diol as a sensitizer.
[2] Commercially available from Union Carbide under the designation "A1100".

The coated wafer was then exposed to a dose of 150 mj/cm$^2$ for 3 seconds at 365 nm using a GCA step and repeat tool. After exposure, the coated wafer was baked at 100° C. for 10 minutes. The image was developed by contacting the coated wafer with a solution of 0.21M KOH for 2.5 minutes, so as to simultaneously remove the uncrosslinked portions of the resist and the overlying portions of the film. The resulting image was etched in an MPT Center Pump tool, operating with 500 watts power, 100 sccm oxygen and 125 microns pressure. The etch rate was about 40 angstroms per minute and the total etch time was 10 minutes, as compared to an etch rate of 1200 angstroms per minute for the non-silylated resist.

EXAMPLE 2

A 4.3μ thick layer of resist[1] was coated on a wafer by spin application at 3500 rpm for 30 seconds, followed by baking at 85° C. for 10 minutes. Then, a 0.7μ thick film was coated on the resist by spin application of a solution of γ-aminopropyltriethoxysilane[2] at 3500 rpm for 30 seconds, followed by baking at 90° C. for 10 minutes.

[1] An m-cresol-novolac type resist, commercially available from American Hoechst Co. under the designation "AZ4330".
[2] Commercially available from Union Carbide under the designation "A1100".

The coated wafer was then exposed to a dose of 150 mj/cm$^2$ for 3 seconds at 365 nm using a GCA step and repeat tool. After exposure, the coated wafer was baked at 100° C. for 10 minutes. The image was developed by contacting the coated wafer with a solution of 0.21M KOH for 25 minutes, so as to simultaneously remove the uncrosslinked portions of the resist and the overlying portions of the film. The resulting image was etched in an MPT Center Pump tool, operating with 500 watts power, 100 sccm oxygen and 125 microns pressure. The etch rate was about 40 angstroms per minute and the total etch time was 10 minutes, as compared to an etch rate of 1200 angstroms per minute for the non-silylated resist.

EXAMPLE 3

The procedure of Example 1 was repeated, except that the aminoalkoxysilane solution employed was a solution of N-β-aminoethyl-γ-aminopropyltrimethoxysilane[1] and, after the post-exposure bake step, the coated wafer was contacted with a solution of 0.21M KOH for 5, instead of 2.5, minutes. The resulting image was etched in an MPT Center Pump tool, operating with 500 watts power, 100 sccm oxygen and 125 microns pressure. The etch rate was about 150 angstroms per minute and the total etch time was 10 minutes, as compared to an etch rate of 1200 angstroms per minute for the non-silylated resist.

[1] Commercially available from Petrach under the designation "A0700".

EXAMPLE 4

The procedure of Example 2 was repeated, except that the aminoalkoxysilane solution employed was a solution of N-β-aminoethyl-γ-aminopropyltrimethoxysilane[1]. The resulting image was etched in an MPT Center Pump tool, operating with 500 watts power, 100 sccm oxygen and 125 microns pressure. The etch rate was about 150 angstroms per minute and the total etch time was 10 minutes, as compared to an etch rate of 1200 angstroms per minute for the non-silylated resist.

[1] Commercially available from Petrach under the designation "A0700".

COMPARATIVE EXAMPLE 1

For purposes of comparison, the procedure of Example 1 was repeated, except that the alkoxysilane solution employed was a solution of amyltriethoxysilane[1] and, after the post-exposure bake step, the coated wafer was contacted with a solution of 0.21M KOH for 1 hour. Dissolving of the resist by the amyltriethoxysilane solution appeared to take place, and the results showed no image formation.

[1] Commercially available from Petrach under the designation "A0950".

COMPARATIVE EXAMPLE 2

For purposes of comparison, the procedure of Example 1 was repeated, except that the alkoxysilane solution employed was a solution of 2-cyanoethyltriethoxysilane[1] and, after the post-exposure bake step, the coated wafer was contacted with a solution of 0.21M KOH for 1 hour. The results showed no image formation.

[1] Commercially available from Petrach under the designation "C3433".

COMPARATIVE EXAMPLE 3

For purposes of comparison, the procedure of Example 1 was repeated, except that the alkoxysilane solution employed was a solution of phenyltriethoxysilane[1] and, after the post-exposure bake step, the coated wafer was contacted with a solution of 0.21M KOH for 1 hour. The results showed no image formation.

[1] Commercially available from Petrach under the designation "P0320".

COMPARATIVE EXAMPLE 4

For purposes of comparison, the procedure of Example 1 was repeated, except that the alkoxysilane solution employed was a solution of vinyltriethoxysilane[1] and, after the post-exposure bake step, the coated wafer was contacted with a solution of 0.21M KOH for 1 hour. Dissolving of the resist by the vinyltriethoxysilane solution appeared to take place, and the results showed no image formation.

[1] Commercially available from Petrach under the designation "V4910".

COMPARATIVE EXAMPLE 5

For purposes of comparison, the procedure of Example 1 was repeated, except that a post-exposure bake step was not performed. Good images resulted, but they did not demonstrate satisfactory resistance to oxygen-reactive ion etching.

COMPARATIVE EXAMPLE 6

For purposes of comparison, the procedure of Example 2 was repeated, except that a post-exposure bake step was not performed. Good images resulted, but they did not demonstrate satisfactory resistance to oxygen-reactive ion etching.

COMPARATIVE EXAMPLE 7

For purposes of comparison, the procedure of Example 3 was repeated, except that a post-exposure bake step was not performed. Good images resulted, but they did not demonstrate satisfactory resistance to oxygen-reactive ion etching.

COMPARATIVE EXAMPLE 8

For purposes of comparison, the procedure of Example 4 was repeated, except that a post-exposure bake step was not performed. Good images resulted, but they did not demonstrate satisfactory resistance to oxygen-reactive ion etching.

What is claimed is:

1. A process for forming a pattern on a substrate, comprising the steps of:
   coating on said substrate a photosensitive organic polymer layer;
   coating on said polymer layer a film comprising an aminoalkoxysilane;
   exposing said coated substrate in a predetermined pattern to radiation;
   heating said coated substrate, after said step of exposing said coated substrate, at a temperature which is sufficient to cause formation of an interfacial silicon-containing coupling layer between said film and said polymer layer; and
   contacting said coated substrate with a solvent so as to simultaneously remove from said substrate the exposed or unexposed portions of said polymer layer, depending upon whether said polymer layer comprises a positive-acting or a negative-acting material, and the overlying portions of said film, thereby forming a pattern which is resistant to oxygen-reactive ion etching.

2. The process of claim 1, wherein said aminoalkoxysilane is an aminotrialkoxysilane represented by the formula:

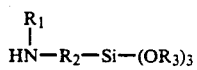

wherein:
   $R_1$ is a hydrogen atom or a saturated hydrocarbon residue or an amino-substituted, saturated hydrocarbon residue, having 1 to 5 carbon atoms;
   $R_2$ is a saturated hydrocarbon residue having 2 to 6 carbon atoms; and
   $R_3$ is a saturated hydrocarbon residue having 1 to 5 carbon atoms;
   or a mixture thereof.

3. The process of claim 2, wherein:
   $R_1$ is a hydrogen atom or a saturated hydrocarbon residue or an amino-substituted, saturated hydrocarbon residue, having 2 or 3 carbon atoms;
   $R_2$ is a saturated hydrocarbon residue having 3 to 6 carbon atoms; and
   $R_3$ is a saturated hydrocarbon residue having 1 to 4 carbon atoms;
   or a mixture thereof;

4. The process of claim 3, wherein said aminotrialkoxysilane is selected from the group consisting of γ-aminopropyltrimethoxysilane, γ-aminopropyltriethoxysilane, N-β-(aminoethyl)-γ-aminopropyltrimethoxysilane and N-β-(aminoethyl)-γ-aminopropyltriethoxysilane and mixtures thereof.

5. The process of claim 1, wherein said coated substrate is heated at a temperature within the range from about 90° to about 160° C.

6. The process of claim 5, wherein said coated substrate is heated at a temperature within the range from about 90° to about 105° C. for a time ranging from about 5 to about 30 minutes.

7. The process of claim 1, wherein said organic polymer layer comprises a novolac resin.

8. The process of claim 7, wherein said organic polymer layer comprises a resist which is based on a phenolic resin and a diester of a 1-oxo-2-diazonaphthalene sulfonic acid with an unsymmetrical primary or secondary aliphatic diol as a sensitizer or is an m-cresol novolac resin with a diazo-ketone sensitizer.

9. A process for forming a pattern on a substrate, comprising the steps of:
   coating on said substrate a photosensitive organic polymer layer;
   coating on said polymer layer a film comprising an aminotrialkoxysilane represented by the formula:

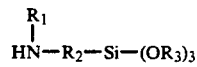

wherein:
   $R_1$ is a hydrogen atom or a saturated hydrocarbon residue or an amino-substituted, saturated hydrocarbon residue, having 1 to 5 carbon atoms;
   $R_2$ is a saturated hydrocarbon residue having 2 to 6 carbon atoms; and
   $R_3$ is a saturated hydrocarbon residue having 1 to 5 carbon atoms;
   or a mixture thereof;
   exposing said coated substrate in a predetermined pattern to radiation;
   heating said coated substrate, after said step of exposing said coated substrate, at a temperature ranging from about 90° to about 160° C. so as to cause formation of an interfacial silicon-containing coupling layer between said film and said polymer layer; and
   contacting said coated substrate with a solvent so as to simultaneously remove from said substrate the exposed or unexposed portions of said polymer layer, depending upon whether said polymer layer comprises a positive-acting or a negative-acting material, and the overlying portions of said film, thereby forming a pattern which is resistant to oxygen-reactive ion etching.

10. The process of claim 9, wherein:
   $R_1$ is a hydrogen atom or a saturated hydrocarbon residue or an amino-substituted, saturated hydrocarbon residue, having 2 or 3 carbon atoms;
   $R_2$ is a saturated hydrocarbon residue having 3 to 6 carbon atoms; and
   $R_3$ is a saturated hydrocarbon residue having 1 to 4 carbon atoms;
   or a mixture thereof.

11. The process of claim 10, wherein said aminotrialkoxysilane is selected from the group consisting of γ-aminopropyltrimethoxysilane, γ-aminopropyltriethoxysilane, N-β-(aminoethyl)-γ-aminopropyltrimethoxysilane and N-β-(aminoethyl)-γ-aminopropyltriethoxysilane and mixtures thereof.

12. The process of claim 11, wherein said coated substrate is heated at a temperature within the range from about 90° to about 105° C. for a time ranging from about 5 to about 30 minutes.

13. The process of claim 12, wherein said organic polymer layer comprises a novolac resin.

14. The process of claim 11, wherein said organic polymer layer comprises a resist which is based on a phenolic resin and a diester of a 1-oxo-2-diazonaphthalene sulfonic acid with an unsymmetrical primary or secondary aliphatic diol as a sensitizer or is an m-cresol novolac resin with a diazo-ketone sensitizer.

* * * * *